US009336938B2

(12) United States Patent
Fujii

(10) Patent No.: US 9,336,938 B2
(45) Date of Patent: May 10, 2016

(54) WIRING SUBSTRATE AND METHOD FOR MANUFACTURING THE WIRING SUBSTRATE

(71) Applicant: SHINKO ELECTRIC INDUSTRIES CO., LTD., Nagano (JP)

(72) Inventor: Tomoharu Fujii, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 13/857,226

(22) Filed: Apr. 5, 2013

(65) Prior Publication Data

US 2013/0271252 A1 Oct. 17, 2013

(30) Foreign Application Priority Data

Apr. 12, 2012 (JP) ................................ 2012-091289
Aug. 22, 2012 (JP) ................................ 2012-183523

(51) Int. Cl.

*H01F 5/00* (2006.01)
*H01F 27/30* (2006.01)
*H01L 27/08* (2006.01)
*H01F 17/00* (2006.01)
*H01F 41/04* (2006.01)

(52) U.S. Cl.

CPC .......... *H01F 17/0006* (2013.01); *H01F 41/041* (2013.01); *H01F 41/046* (2013.01); *H01F 2017/0066* (2013.01)

(58) Field of Classification Search

CPC .............. H01F 17/0006; H01F 41/041; H01F 2017/0086; H01F 41/042; H01F 17/0013; H01F 41/046; H01L 23/49822; H01L 23/645; H01L 28/10

USPC ................. 336/199, 200, 205, 206, 207, 208; 257/531

See application file for complete search history.

(56) References Cited

U.S. PATENT DOCUMENTS 5,312,674 A * 5/1994 Haertling .............. H01L 23/055 252/62
5,583,474 A * 12/1996 Mizoguchi .......... H01F 17/0006 336/200
5,874,883 A * 2/1999 Uemura .............. H01F 17/0006 336/200
5,896,078 A * 4/1999 Hayakawa ............. B82Y 25/00 148/306
6,136,458 A * 10/2000 Inoue .................. H01F 17/0006 427/128
6,351,204 B1 * 2/2002 Yamasawa ............ H01F 10/187 336/200
6,646,828 B1 * 11/2003 Sasaki ...................... 360/125.43
6,727,571 B2 * 4/2004 Sugiyama ........... H01F 17/0006 257/528
6,831,543 B2 * 12/2004 Mizoguchi .......... H01F 17/0006 336/200
6,838,970 B2 * 1/2005 Basteres et al. ............... 336/200
7,271,693 B2 * 9/2007 Ding ................... H01F 17/0006 336/200
7,307,503 B2 * 12/2007 Kaji et al. ..................... 336/200
7,612,963 B2 * 11/2009 Allen .................. G11B 5/1278 360/123.06

(Continued)

FOREIGN PATENT DOCUMENTS

JP 2001-077538 3/2001
JP 2001284533 A * 10/2001

(Continued)

*Primary Examiner* — Alexander Talpalatski
*Assistant Examiner* — Joselito Baisa
(74) *Attorney, Agent, or Firm* — IPUSA, PLLC

(57) ABSTRACT

A wiring substrate includes a first insulating layer, a first magnetic layer that is a first plating film formed on the first insulating layer, a flat coil formed on the first magnetic layer, and a second magnetic layer that is a second plating film formed on the flat coil.

25 Claims, 9 Drawing Sheets

(56) References Cited

U.S. PATENT DOCUMENTS

| | | | | |
|---|---|---|---|---|
| 7,969,274 | B2 * | 6/2011 | Brennan et al. | 336/200 |
| 8,004,382 | B2 * | 8/2011 | Mashino | H01F 17/0013 29/602.1 |
| 8,248,200 | B2 * | 8/2012 | Ishimoto | H01F 17/0006 336/192 |
| 2007/0247268 | A1 * | 10/2007 | Oya et al. | 336/200 |
| 2008/0030905 | A1 * | 2/2008 | Yamanaka | G11B 5/1278 360/313 |
| 2012/0019343 | A1 * | 1/2012 | Hsieh et al. | 336/192 |
| 2012/0326827 | A1 * | 12/2012 | Nanjyo et al. | 336/200 |

FOREIGN PATENT DOCUMENTS

| | | |
|---|---|---|
| JP | 2007-281230 | 10/2007 |
| JP | 2008-103603 | 5/2008 |

* cited by examiner

WIRING SUBSTRATE AND METHOD FOR MANUFACTURING THE WIRING SUBSTRATE

CROSS-REFERENCE TO RELATED APPLICATIONS

This application is based upon and claims the benefit of priority of the prior Japanese Patent Application Nos. 2012-091289 and 2012-183523 filed on Apr. 12, 2012 and Aug. 22, 2012, respectively, the entire contents of which are incorporated herein by reference.

FIELD

The embodiments discussed herein are related to a wiring substrate and a method for manufacturing the wiring substrate.

BACKGROUND

A conventional pattern coil of a printed board has an overall shape of a spiral. The pattern coil is manufactured by, for example, forming four C-shaped coil patterns on the surfaces of three layers of a multilayer built-up substrate and connecting the coil patterns with built-up vias (see, for example, Japanese Laid-Open Patent Publication No. 2001-077538).

However, because the conventional pattern coil is a component having a large size, it is difficult to install the pattern coil to a package of a processor such as a CPU (Central Processing Unit).

SUMMARY

According to an aspect of the invention, there is provided a wiring substrate including a first insulating layer, a first magnetic layer that is a first plating film formed on the first insulating layer, a flat coil formed on the first magnetic layer, and a second magnetic layer that is a second plating film formed on the flat coil.

The object and advantages of the invention will be realized and attained by means of the elements and combinations particularly pointed out in the claims.

It is to be understood that both the foregoing general description and the followed detailed description are exemplary and explanatory and are not restrictive of the invention as claimed.

DESCRIPTION OF EMBODIMENTS

Before describing illustrative embodiments of the present invention, a wiring substrate of a comparative example and problems of the comparative example are described.

COMPARATIVE EXAMPLE

Figure 1:
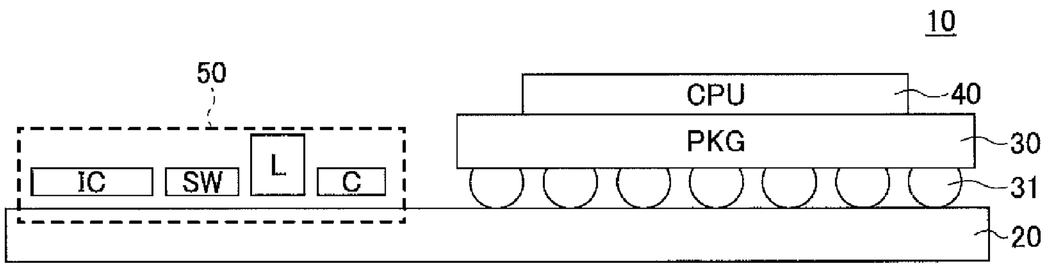
FIG. 1 is a schematic diagram illustrating a wiring substrate unit of a comparative example.

FIG. 1 is a schematic diagram illustrating a wiring substrate unit 10 of the comparative example.

The wiring substrate unit 10 of the comparative example includes a mother board 20, a package substrate 30, a CPU 40, and a power supply circuit 50.

The wiring substrate unit 10 is used for an electronic device such as a mobile phone, a smart phone, or a game device.

The motherboard 20 is, for example, a wiring substrate complying with a FR-4 (Flame Retardant type 4) standard. For example, the motherboard 20 is manufactured by layering plural wiring layers and plural insulating layers. The package substrate 30 having the CPU 40 loaded thereon is mounted on the motherboard 20 by way of solder 31 of a BGA (Ball Grid Array). Further, the power supply circuit 50 is also mounted on the motherboard 20.

The package substrate 30, which has the CPU 40 loaded thereon, functions as an interposer. The package substrate 30 is, for example, a wiring substrate such as a built-up substrate. For example, the package substrate 30 is manufactured by layering plural wiring layers and plural insulating layers.

The CPU 40 is a processor that performs operations for an electronic device to which the wiring substrate unit 10 is mounted. The electric power output from the power supply circuit 50 is supplied to the CPU 40 by way of the motherboard 20 and the package substrate 30.

The power supply circuit 50 is a circuit that generates a driving voltage of the CPU 40 (i.e. voltage for driving the CPU 40) and supplies the generated driving voltage to the CPU 40. The power supply circuit 50 generates the driving voltage, for example, by stepping down the electric power supplied from a battery (not illustrated) or an external power source (not illustrated). The power supply circuit 50 includes electronic components such as a switching device SW, a coil L, a capacitor C, and an IC (Integrated Circuit). The switching device SW, the coil L, and the capacitor C constitute a step down circuit. The step down circuit drives the switching device SW by using the IC (serving as a controller) and outputs electric power rectified by the coil L and the capacitor C.

The above-described wiring substrate unit 10 has a relatively large size because the coil L of the power supply circuit 50 requires a certain amount of inductance and is typically wrapped by a magnetic material for obtaining inductance. Particularly, in a case where a coil that is commercially sold as a general-purpose electronic component is used as the coil L of the power supply circuit 50, the power supply circuit 50 cannot be mounted to the package substrate 30 because the coil L has a certain height. Therefore, the power supply circuit 50 is arranged outside the package substrate 30.

Accordingly, in a case where the power supply circuit 50 is arranged outside the package substrate 30, the power output from the power supply circuit 50 is supplied to the CPU 40 by way of the motherboard 20 and the package substrate 30.

As a result, the impedance of a power supply path between the CPU 40 and the power supply circuit 50 (i.e. path constituted by the motherboard 20 and the package substrate 30) becomes high. Thereby, power supplying efficiency is degraded.

Further, in order to reduce the impedance of the power supply path, the size of a power supply plane (plane used for supplying power) and the size of a ground plane (plane used as a ground) are required to be increased. Therefore, in order to improve the power supplying efficiency of the wiring substrate unit 10 having the configuration illustrated in FIG. 1, the size of the motherboard 20 or the size of the package substrate 30 is to be increased. However, increasing the size of the wiring substrate is difficult to achieve for an electronic device.

Further, increasing the size of the power supply plane and the ground plane constrains the arrangement of each of the power supply plane and the ground plane in relation with wiring (e.g., I/O wiring) inside the motherboard 20 and the package substrate 30.

The above-described problems are significant particularly for the package substrate 30 having a size smaller than the motherboard 20.

Similar to the printed board disclosed in Japanese Laid-Open Patent Publication No. 2001-077538, a coil may be fabricated by using a wiring of the motherboard 20 or the package substrate 30. However, in order to obtain inductance, a magnetic material is to be positioned near the coil.

Further, with the motherboard 20 or the package substrate 30 of a typical wiring substrate as the comparative example illustrated in FIG. 1, a magnetic material cannot be assembled to the wiring substrate from a manufacturing standpoint. Therefore, it is difficult to provide a coil used for the power supply circuit 50 to the motherboard 20 or the package substrate 30 of the comparative example.

Further, in the case of fabricating a coil by using a wiring of the motherboard 20 or the package substrate 30 without arranging a magnetic material on the motherboard 20 or the package substrate 30, the size of the coil is to be increased for obtaining inductance. This results in an increase in the size of the motherboard 20 or the package substrate 30.

In a case where parasitic capacity becomes large due to the increase of the size of the power supply plane or the ground plane or a case where the parasitic capacity of the power supply circuit 50 is large, a capacitor is to be provided for cancelling the parasitic capacity. However, due to the constraints of arranging the capacitor with respect to other wirings, the providing of the capacitor results to an increase in the size of the motherboard 20 or the package substrate 30

Because size reduction of the coil L of the power supply circuit 50 is difficult to achieve with the wiring substrate unit 10 of the comparative example, the wiring substrate unit 10 faces problems such as degrading of power supplying efficiency, increase in the size of the wiring substrate, constraints in arranging respective electronic components, the power supply plane, and the ground plane.

The below-described embodiments of a wiring substrate and a method for manufacturing the wiring substrate are aimed at solving the aforementioned problems.

<First Embodiment>

FIGS. 2A-2D are schematic diagrams illustrating a wiring substrate 100 according to the first embodiment of the present invention.

Figure 2A:
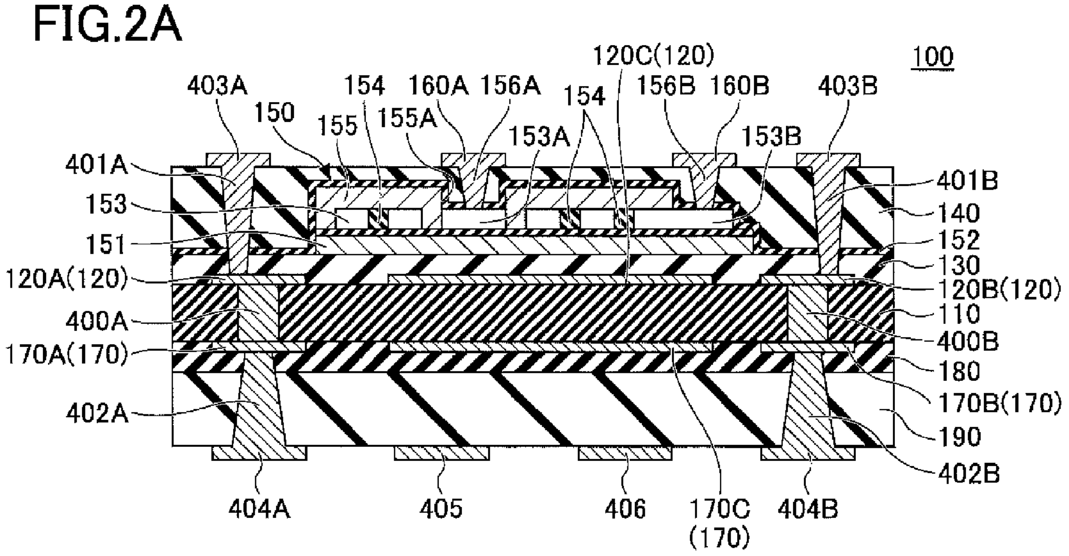
FIGS. 2A-2D are schematic diagram illustrating a wiring substrate according to the first embodiment of the present invention.

FIG. 2A is a cross-sectional view of the wiring substrate 100 according to the first embodiment of the present invention. As illustrated in FIG. 2A, the wiring substrate 100 includes a core substrate 110, a wiring layer 120 (120A, 120B, 120C), an insulating layer 130, an insulating layer 140, a coil 150, wirings 160A, 160B, a wiring layer 170 (170A, 170B, 170C), an insulating layer 180, and an insulating layer 190. Further, the wiring substrate 100 includes through-hole parts 400A, 400B, vias 401A, 401B, 402A, 402B, and wiring layers 403A, 403B, 404A, 404B, 405, 406.

FIG. 2A illustrates a state where the wiring layer 120, the insulating layer 130, the insulating layer 140, the coil 150, and the wirings 160A, 160B are provided on an upper side of the core substrate 110 whereas the wiring layer 170, the insulating layer 180, and the insulating layer 190 are provided on a lower side of the core substrate 110. It is, however, to be noted that the positional state of FIG. 2A is for illustrative purposes. For example, the wiring substrate 10 can be used in a state upside-down relative to the state of FIG. 2A. Alternatively, the wiring substrate 10 can be used in a state tilted to a predetermined angle relative to the state of FIG. 2A.

Likewise, a surface positioned on an upper side in the accompanying drawings is referred to as "upper surface" and a surface positioned on a lower side in the accompanying drawings is referred to as "lower surface" for illustrative purposes. Thus, the terms "upper surface" and "lower surface" are not universally interpreted as a surface positioned on an upper side and a surface positioned on a lower side. In a case where the wiring substrate 100 is positioned in an upside-down state, an upper surface becomes a lower surface in, for example, FIG. 2A and a lower surface becomes an upper surface in, for example, FIG. 2A.

Figure 2B:
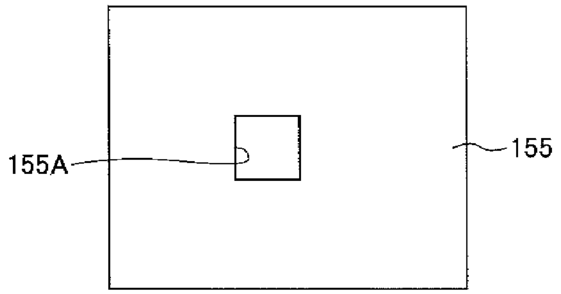
Figure 2C:
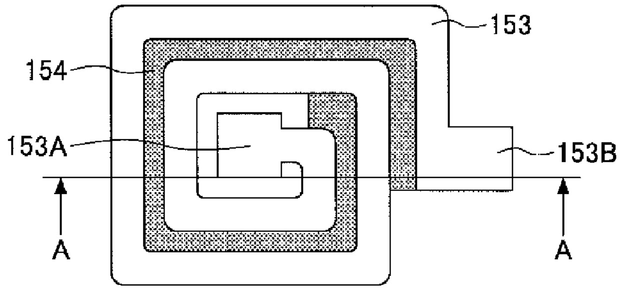
Figure 2D:
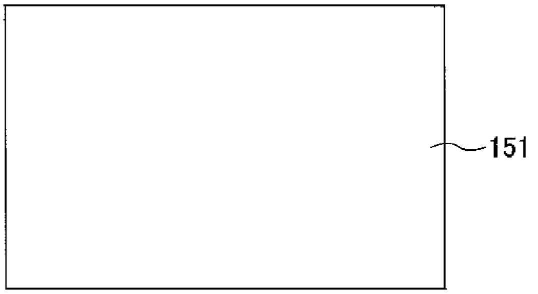

FIG. 2B is a plan view of a magnetic layer 155 included in the coil 150 of the wiring substrate 100 according to the first embodiment of the present invention. FIG. 2C is a plan view of a coil part 153 and an insulating resin 154 included in the coil 150 of the wiring substrate 100 according to the first embodiment of the present invention. FIG. 2D is a plan view of a magnetic layer 151 included in the coil 150 of the wiring substrate 100 according to the first embodiment of the present invention.

As illustrated in FIG. 2A, the core substrate 110 has one surface on which the wiring layer 120 is formed and another surface on which the wiring layer 170 is formed. For example, the core substrate 110 may be a substrate obtained by impregnating a glass cloth substrate with an epoxy resin. Through-hole parts 400A, 400B are formed in the core substrate 110. The through-hole parts 400A, 400B may be formed by using, for example, a plating process. The through-hole parts 400A, 400B may be a copper plating film formed on an inner wall of the through-holes formed in the core substrate 110 or a copper plating filling the through-holes formed in the core substrate 110.

The wiring layer 120A is connected to an upper end of the through-hole part 400A, and the wiring layer 170A is connected to a lower end of the through-hole part 400A. Further, the wiring layer 120B is connected to an upper end of the through-hole part 400B, and the wiring layer 170B is connected to a lower end of the through-hole part 400B.

The wiring layer 120 is provided on a surface of the core substrate 110. The wiring layer 120 includes a wiring that is formed in a predetermined pattern from a plan view. In this embodiment, the wiring layer 120 is described as being formed on an upper surface of the core substrate 110.

The wiring layer 120 is divided into the wiring layers 120A, 120B, and 120C. The wiring layers 120A-120C may be formed by, for example, patterning a copper foil provided on the upper surface of the core substrate 110.

The wiring layer 120A has a lower surface to which the through-hole part 400A is connected and an upper surface to which the via 401A is connected. The wiring layer 120B has a lower surface to which the through-hole part 400B is connected and an upper surface to which the via 401B is connected. In the following, the wiring layers 120A, 120B, and 120C are collectively referred to as "wiring layer 120" unless described to be distinct from each other.

The insulating layer 130 is provided on the upper surface of the wiring layer 120. The insulating layer 130 is an example of a first insulating layer. The insulating layer 130 serves as a base when forming the coil 150.

The insulating layer 130 may be a film-like insulating layer formed of, for example, an epoxy resin or a polyimide resin. The insulating layer 130 is an example of an insulating layer included in a built-up substrate.

The insulating layer 140 is provided on the upper surface of the insulating layer 130 and the upper surface of the coil 150 interposed by an insulating film 152. The insulating layer 140 is one example of a second insulating layer. The insulating layer 140 may be a film-like insulating layer formed of, for example, an epoxy resin or a polyimide resin. The insulating layer 140 is an example of an insulating layer included in a built-up substrate.

The coil 150 is formed on the upper surface of the insulating layer 130 and inside the insulating layer 140. The coil 150 includes the magnetic layer 151, the insulating film 152, the coil part 153, an insulating resin 154, and the magnetic layer 155. The coil 150 is a flat coil. The coil part 153 has one end 153A connected to the wiring 160A interposed by the via 156A and another end 153B connected to the wiring 160B interposed by the via 156B. The via 156A and the via 156B are inserted to corresponding openings formed in the insulating film 152 and connected to the one end 153A and the other end 153B of the coil part 153, respectively. It is to be noted that the coil 150 illustrated in FIG. 2A represents a cross section of FIG. 2C taken along line A-A.

The magnetic layer 151 is formed on the upper surface of the insulating layer 130 as illustrated in FIG. 2A. As illustrated in FIG. 2D, the magnetic layer 151 is patterned into a rectangular shape from a plan view. The magnetic layer 151 is larger than the coil part 153 (that is to be formed thereon) from a plan view (see, for example, FIG. 2C). In addition, the magnetic layer 151 is arranged, so that an outer periphery of the magnetic layer 151 encompasses the coil 153 from a plan view.

The magnetic layer 151 is formed of, for example, an alloy of zinc and ferrite (Zn—Fe). The magnetic layer 151 may be a zinc-ferrite alloy film formed by a plating process (plating film). The magnetic layer 151 is an example of a first magnetic layer. Because the zinc-ferrite alloy film, which is formed by the plating process, has a relatively high resistance (approximately 100Ω), the zinc-ferrite alloy film is suitable for forming the coil part 153. The thickness of the magnetic layer 151 may be, for example, approximately 5 μm to 10 μm.

As illustrated in FIG. 2A, the insulating film 152 is formed between the insulating layer 130 and the insulating layer 140, on an upper surface of the magnetic layer 151, an upper surface of a part of the coil part 153, and on an upper surface of the magnetic layer 155. The insulating film 152 is an example of an insulating film. Details of the portion where the insulating film 152 is formed and details of manufacturing the insulating film 152 are described below. The insulating film 152 is formed of, for example, a resin film (e.g., polyimide). The thickness of the insulating film 152 may be, for example, approximately 3 μm to 10 μm.

As illustrated in FIG. 2A, the coil part 153 is formed on the insulating film 152 on the upper surface of the magnetic layer 151. As illustrated in FIG. 20, the coil part 153 is a flat coil that coils in a rectangular shape from a plan view. As described above, the coil part 153 includes the one and the other ends 153A, 153B. The coil part 153 may also be referred to as a "spiral coil" or a "planar coil".

The coil part 153 is formed of, for example, copper. The coil part 153 may be formed by using a plating process (plating film). The thickness of the coil part 153 may be, for example, approximately 10 μm to 20 μm.

The coil part 153 is coiled twice from the one end 153A to the other end 153B in a clockwise direction and forms a rectangular shape in a plan view. In this embodiment, the number of coils of the coil part 153 is 2.5 coils. However, the number of coils of the coil part 153 may be determined in accordance with, for example, the inductance required for a given purpose. For example, the number of coils of the coil part 153 may be approximately 100 coils or more.

The one end 153A of the coil part 153 is connected to the wiring 160A interposed by the via 156A. The other end 153B of the coil part 153 is connected to the wiring 160B interposed by the via 156B.

As illustrated in FIG. 2C, the insulating resin 154 is formed between the coils of the coil part 153 (i.e. shaded area in FIG. 2C) except at the periphery of the one end 153A and a portion of the periphery of the other end 153B. The inductance of the coil 150 decreases by forming the magnetic layer 151 or the magnetic layer 155 between the coils of the coil part 153. Therefore, in order to prevent the inductance of the coil 150 from decreasing, the insulating resin 154 is formed between the coils of the coil part 153.

The coil part 153 is referred to as a flat coil because the coil part 153 is flatly coiled.

As illustrated in FIG. 2A, the insulating resin 154 is formed in a space between parts of the coil part 153. The insulating resin 154 is an example of an insulating part. As illustrated in FIG. 2C, the area in which the insulating resin 154 is formed is an inner side area of the coil part 153 excluding the periphery of the one end 153A and a portion of the periphery of the other end 153B. The insulating resin 154 is formed of, for example, a photosensitive epoxy resin.

As illustrated in FIG. 2A, the magnetic layer 155 is formed covering an upper surface of the coil part 153 except for the upper surfaces of the one and the other ends 153A, 153B, a portion of a side surface of the coil part 153, and a portion of an upper surface of the insulating film (e.g., polyimide film) 152.

The magnetic layer 155 is formed of, for example, an alloy of zinc and ferrite (Zn—Fe). The magnetic layer 155 may be a zinc-ferrite alloy film formed by a plating process (plating film). The magnetic layer 155 is an example of a second magnetic layer.

As illustrated in FIG. 2B, the magnetic layer 155 includes an opening 155A at its center from a plan view. As illustrated in FIG. 2A, the opening 155A is formed at a position above the one end 153A of the coil part 153. The opening 155A is formed in this position, so that the magnetic layer 155 can avoid the one end 153A of the coil part 153. The length of the magnetic layer 155 in the horizontal direction of FIG. 2A is shorter than the length of the magnetic layer 151 in the horizontal direction of FIG. 2A (see, for example, FIG. 2D). The other end 153B of the coil part 153 is not covered by the magnetic layer 155 from a plan view. The thickness of the magnetic layer 155 is, for example, approximately 5 μm to 10 μm. The thickness of the coil 150, that is, the distance between the upper surface of the magnetic layer 155 and lower surface of the magnetic layer 151 (including the thickness of the coil part 153) may be, for example, approximately 40 μm to 60 μm.

The via 156A connects the one end 153A of the coil part 153 and the wiring 160A. The via 156B connects the other end 153B of the coil part 153 and the wiring 160B. The via 156A is an example of a first via. The via 156B is an example of a second via.

The wirings 160A, 160B are formed on an upper surface of the insulating layer 140. The wiring 160A is connected to the one end 153A of the coil part 153 interposed by the via 156A. The wiring 160B is connected to the other end 153B of the coil part 153 interposed by the via 1568. The wiring 160A is an example of a first wiring part. The wiring 160B is an example of a second wiring part.

The wiring layer 170 is provided on a surface of the core substrate 110. The wiring layer 170 may include a wiring that is formed in a predetermined pattern from a plan view. In this embodiment, the wiring layer 170 is described as being formed on a lower surface of the core substrate 110.

The wiring layer 170 is divided into the wiring layers 170A, 170B, and 170C. The wiring layers 170A-170C may be formed by, for example, patterning a copper foil provided on the lower surface of the core substrate 110.

The wiring layer 170A has an upper surface to which the through-hole part 400A is connected and an lower surface to which a via 402A is connected. The wiring layer 170B has an upper surface to which the through-hole part 400B is connected and a lower surface to which a via 402B is connected. In the following, the wiring layers 170A, 170B, and 170C are collectively referred to as "wiring layer 170" unless described to be distinct from each other.

The insulating layer 180 is provided on the lower surface of the wiring layer 170. The insulating layer 180 has substantially the same thickness as the thickness of the insulating layer 130. The insulating layer 180 may be a film-like insulating layer formed of, for example, an epoxy resin or a polyimide resin. The insulating layer 180 is an example of an insulating layer included in a built-up substrate.

The insulating layer 190 is formed on a lower surface of the insulating layer 180. The insulating layer 190 may be a film-like insulating layer formed of, for example, an epoxy resin or a polyimide resin. The insulating layer 190 is an example of an insulating layer included in a built-up substrate.

The through-hole part 400A has an upper end to which the wiring layer 120A is connected and a lower end to which the wiring layer 170A is connected. The through-hole part 400B has an upper end to which the wiring layer 120B is connected and a lower end to which the wiring layer 170B is connected.

The via 401A is formed from a surface of the insulating layer 140 to a surface of the wiring layer 120A. The via 401A is formed in a hole penetrating the insulating layer 130, the insulating layer 140, and the insulating film 152. The via 401A is formed by, for example, filling the inside of the hole with a copper plating. For example, a semi-additive method may be used to form the via 401A. The via 401A is integrally formed with the wiring layer 403A. That is, the lower end of the via 401A is connected to the wiring layer 120A and the upper end of the via 401A is connected to the wiring layer 403A.

The via 401B is formed from a surface of the insulating layer 140 to a surface of the wiring layer 120B. The via 401B is formed in a hole penetrating the insulating layer 130, the insulating layer 140, and the insulating film 152. The via 401B is formed by, for example, filling the inside of the hole with a copper plating. For example, a semi-additive method may be used to form the via 401B. The via 401B is integrally formed with the wiring layer 403B. That is, the lower end of the via 401B is connected to the wiring layer 120B and the upper end of the via 401B is connected to the wiring layer 403B. The wirings 403A, 403B are formed on the upper surface of the insulating layer 140.

The via 402A is formed from a surface (lower surface) of the insulating layer 190 to a surface (lower surface) of the wiring layer 170A. The via 402A is formed in a hole penetrating the insulating layer 180 and the insulating layer 190. The via 402A is formed by, for example, filling the inside of the hole with a copper plating. For example, a semi-additive method may be used to form the via 402A. The via 402A is integrally formed with the wiring layer 404A. That is, the upper end of the via 402A is connected to the wiring layer 170A and the lower end of the via 402A is connected to the wiring layer 404A.

The via 402B is formed from a surface (lower surface) of the insulating layer 190 to a surface (lower surface) of the wiring layer 170B. The via 402B is formed in a hole penetrating the insulating layer 180 and the insulating layer 190. The via 402B is formed by, for example, filling the inside of the hole with a copper plating. For example, a semi-additive method may be used to form the via 402B. The via 402B is integrally formed with the wiring layer 404B. That is, the upper end of the via 402E is connected to the wiring layer 170B and the lower end of the via 402E is connected to the wiring layer 404B. The wirings 404A, 404E are formed on the lower surface of the insulating layer 190.

The wiring layers 405, 406 are formed between the wiring layer 404A and the wiring layer 404B on the lower surface of the insulating layer 190. The wiring layers 405, 406 are formed by using, for example, a semi-additive method.

The wiring substrate 100 according to the above-described first embodiment includes the coil 150 having the magnetic layer 151, the coil part 153, and the magnetic layer 155 formed by a plating process.

Because the magnetic layer 151, the coil part 153, and the magnetic layer 155 of the coil 150 can be formed by a plating process, the inside of the wiring substrate 100 can be easily formed.

Further, the coil part 153 is covered by the magnetic layer 151 and the magnetic layer 155 except for a portion corresponding to the one end 153A and the other end 153B. Further, the magnetic layers 151, 155 cover the upper surface of the coil part 153, the lower surface of the coil part 153, and a portion of the side surface of the coil part 153.

Therefore, compared to a case where the magnetic layers 151, 155 are not formed, the inductance of the coil part 153 can be improved and the size of the coil part 153 can be reduced.

Figure 3A:
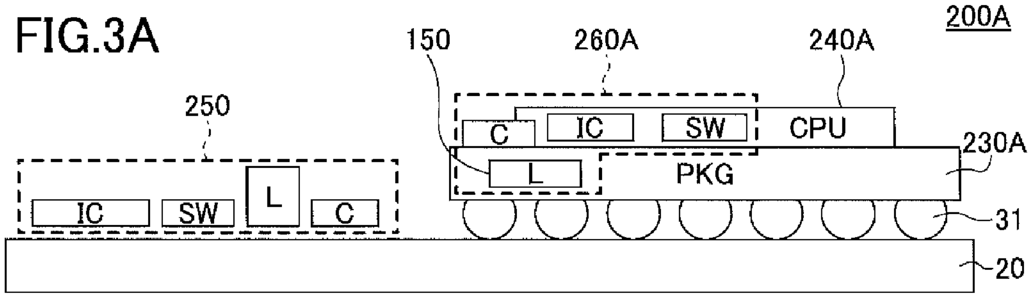
FIGS. 3A-3C are schematic diagrams illustrating examples of wiring substrate units using a wiring substrate according to the first embodiment of the present invention.
Figure 3B:
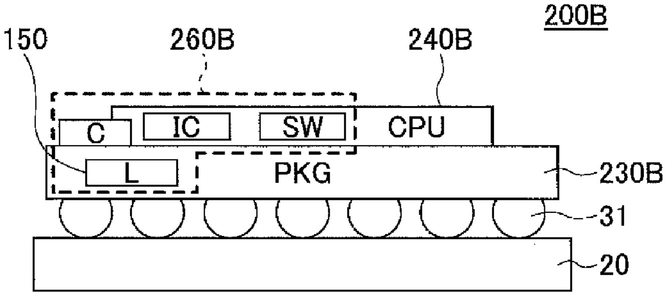
Figure 3C:
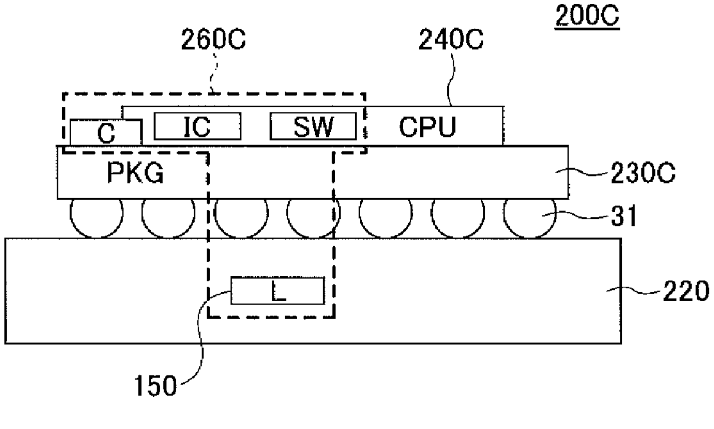

FIGS. 3A-3C are schematic diagrams illustrating examples of wiring substrate units 200A-200C using the wiring substrate 100 according to the first embodiment of the present invention. In FIGS. 3A-3C, like components are denoted with like reference numerals as the reference numerals of the wiring substrate unit 10 of the comparative example (see, for example, FIG. 1) and are not further explained.

The wiring substrate unit 200A illustrated in FIG. 3A includes a motherboard 20, a package substrate 230A, a CPU 240A, and a power supply circuit 250.

The wiring substrate unit 200A may be used for an electronic device such as a mobile phone, a smart phone terminal, or a game device.

The package substrate 230A having the CPU 240A loaded thereon is mounted on the motherboard 20 by way of solder 31 of a BGA (Ball Grid Array). Further, the power supply circuit 250 is also mounted on the motherboard 20.

The package substrate 230A, which has the CPU 240A loaded thereon, functions as an interposer. The package substrate 230A is, for example, a wiring substrate such as a built-up substrate. For example, the package substrate 230A is manufactured by layering plural wiring layers and plural insulating layers.

The package substrate 230A is a package substrate using the wiring substrate 100 illustrated in FIG. 2A and includes the coil 150. The coil 150 is electrically connected to the integrated circuit IC and the switching device SW installed in the CPU 240A and the capacitor C mounted to the package substrate 230A, to thereby constitute a power supply circuit 260A.

The CPU 240A is a processor that performs operations for an electronic device to which the wiring substrate unit 200A is mounted. The CPU 240A includes the switching device SW and the integrated circuit IC that in part constitute the power supply circuit 260A. The integrated circuit IC functions as a controller of the power supply circuit 260A and drives the switching device SW.

The power supply circuit 260A, which is constituted by the coil 150 installed in the package substrate 230A, the integrated circuit IC and switching device SW installed in the CPU 240A, and the capacitor C mounted to the package substrate 230A, supplies power to the CPU 240A. A capacitor serving as a chip component may be used as the capacitor C.

The power supply circuit 250 steps down power supplied from a battery (not illustrated) or an external power source (not illustrated) and supplies the stepped-down power to the power supply circuit 260A constituted by the coil 150 installed in the package substrate 230A, the integrated circuit IC and switching device SW installed in the CPU 240A, and the capacitor C mounted to the package substrate 230A.

The power supply circuit 250 includes the switching device SW, the coil L, the capacitor C, and the integrated circuit IC. The switching device SW, the coil. L, and the capacitor C constitute a step-down circuit. In the power supply circuit 250, the switching circuit SW is driven by the integrated circuit IC functioning as a controller, and power is rectified by the coil L and the capacitor C. Thereby, the rectified power is output from the power supply circuit 250.

With the wiring substrate unit 200A, power supplied from a power source (e.g., battery (not illustrated)) to the power supply circuit 250 is stepped-down by the power supply circuit 250. Then, the stepped-down power supplied from the power supply circuit 250 to the power supply circuit 260A is further stepped down by the power supply circuit 260A. Then, the further stepped-down power is supplied from the power supply circuit 260A to the CPU 240A.

A portion of the power supply circuit 260A (integrated chip IC, switching device SW) is included in the CPU 240A. The capacitor C is mounted to the package substrate 230A. The coil 150 is included in the package substrate 230A. In other words, the power supply circuit 260A is positioned significantly nearer to the CPU 240A than the power supply circuit 250.

Therefore, for example, in a case where power having a voltage value 5 V is supplied from a power source (e.g., battery (not illustrated)) to the power supply circuit 250, the power is stepped down to 3 V by the power supply circuit 250 and supplied to the power supply circuit 260A. Then, the power supplied to the power supply circuit 260A is further stepped down to 1 V by the power supply circuit 260A and supplied to, for example, a core (not illustrated) of the CPU 240A.

Accordingly, in a case of stepping down a power source voltage of 5 V to 1 V and supplying the stepped down voltage to the CPU 240A, the conversion of 3 V to 1 V is performed by the power supply circuit 260A that is positioned in the immediate vicinity of the core (not illustrated) of the CPU 240A.

Therefore, compared to a case of using the wiring substrate unit 10 (see FIG. 1) of the comparative example to step down a power source voltage of 5 V to 1 V with the power supply circuit 50 and supply the stepped-down voltage to the CPU 40, the wiring substrate unit 200A according to the first embodiment of the present invention can supply a power source voltage more efficiently.

The power source voltage can be supplied more efficiently because the wiring substrate 100 (see FIG. 2(A)) used as the package substrate 230A includes a small sized coil 150 that provides high inductance.

Because the magnetic layer 151, 155 that can be formed with a plating process and the coil part 153 formed with a plating process are included in the coil 150, a small space can be obtained inside the wiring substrate 100 (package substrate 230A). Further, high impedance desired for the power supply circuit 260A can be attained.

Therefore, the efficiency of power supply by the wiring substrate unit 200A of the first embodiment of the present invention can be improved compared to the wiring substrate unit 10 of the comparative example (see FIG. 1).

Further, a large portion of the periphery of the coil part 153 of the coil 150 (i.e. portion of the periphery of the coil part 153 of the coil 150 excluding the one and the other ends 153A, 153B) is covered by the magnetic layer 151 and the magnetic layer 155. Therefore, the noise generated from the coil 150 by the switching of the switching device SW hardly penetrates the magnetic layers 151, 155. Thereby, the noise of the coil 150 can be prevented from reaching, for example, the CPU 240A.

For example, in a case where a printed circuit of a related art device having no magnetic material covering its coil is used as the package substrate 230A illustrated in FIG. 3A, the noise generated by switching is radiated from the coil. Thus, the noise may adversely affect operation of the CPU 240A.

On the other hand, with the wiring substrate 200A of the first embodiment of the present invention, the CPU 240A can be prevented from being adversely affected by noise from the coil 150. Because adverse effects from noise can be prevented, the wiring substrate unit 200A exhibiting satisfactory noise resistance such as EMS (Electro Magnetic Susceptance) or EMI (Electro Magnetic Interference) can be provided.

Further, because the power supply circuit 260A is a low voltage power source with an output voltage of 1 V, the integrated circuit IC functioning as a controller and the switching device SW can be installed in the CPU 240A. Thereby, a power supply circuit can be provided with higher efficiency, and POL (Point of Load) can be achieved.

FIG. 3B is a schematic diagram illustrating an example of a wiring substrate unit 200B using the wiring substrate 100 according to the first embodiment of the present invention.

The wiring substrate unit 200B illustrated in FIG. 38 includes a motherboard 20, a package substrate 230B, and a CPU 240B.

The wiring substrate unit 2008 may be used for an electronic device such as a mobile phone, a smart phone terminal, or a game device.

The package substrate 230B having the CPU 2408 loaded thereon is mounted on the motherboard 20 by way of solder 31 of a BGA (Ball Grid Array).

The package substrate 230B, which has the CPU 240B loaded thereon, functions as an interposer. The package substrate 230B is, for example, a wiring substrate such as a built-up substrate. For example, the package substrate 230B is manufactured by layering plural wiring layers and plural insulating layers.

The package substrate 2308 is a package substrate using the wiring substrate 100 illustrated in FIG. 2A and includes the coil 150. The coil 150 is electrically connected to the integrated circuit IC and the switching device SW installed in the CPU 240E and the capacitor C mounted to the package substrate 230B, to thereby constitute a power supply circuit 260B.

The CPU 240B is a processor that performs operations for an electronic device to which the wiring substrate unit 200E is mounted. The CPU 240B includes the switching device SW and the integrated circuit IC that in part constitute the power supply circuit 260B. The integrated circuit IC functions as a controller of the power supply circuit 260E and drives the switching device SW.

The power supply circuit 260B, which is constituted by the coil 150 installed in the package substrate 230B, the integrated circuit IC and switching device SW installed in the CPU 240B, and the capacitor C mounted to the package substrate 2308, supplies power to, for example, a core (not illustrated) of the CPU 240B.

With the wiring substrate unit 2008, power supplied from a power source (e.g., battery (not illustrated)) to the power supply circuit 260E is stepped-down by the power supply circuit 260B. Then, the stepped-down power is supplied from the power supply circuit 260B to, for example, the core (not illustrated) of the CPU 240B.

A portion of the power supply circuit 260B (integrated chip IC, switching device SW) is included in the CPU 240B. The capacitor C is mounted to the package substrate 230B. The coil 150 is included in the package substrate 230B. In other words, the power supply circuit 260B is positioned significantly nearer to the CPU 240E than the power supply circuit 50 of the wiring substrate unit 10 of the comparative example (see FIG. 1).

Therefore, for example, in a case where power having a voltage value 5 V is directly supplied from a power source (e.g., battery (not illustrated)) to the power supply circuit 260B, the power is stepped down to 1 V by the power supply circuit 260B and supplied to, for example, a core (not illustrated) of the CPU 240B.

Accordingly, with the wiring substrate unit 200B illustrated in FIG. 3B, a power source voltage of 5 V can be stepped down by the power supply circuit 260B that is positioned in the immediate vicinity of the core (not illustrated) of the CPU 240B.

Therefore, compared to a case of using the wiring substrate unit 10 (see FIG. 1) of the comparative example to step down a power source voltage of 5 V to 1 V with the power supply circuit 50 and supply the stepped-down voltage to the CPU 40, the wiring substrate unit 200B according to the first embodiment of the present invention can supply a power source voltage more efficiently.

Moreover, the wiring substrate unit 200B according to the first embodiment of the present invention can supply a power source voltage more efficiently than the wiring substrate unit 200A illustrated in FIG. 3A.

The power source voltage can be supplied more efficiently because the wiring substrate 100 (see FIG. 2(A)) used as the package substrate 230B includes a small sized coil 150 that provides high inductance. The coil 150 can attain high impedance desired for the power supply circuit 260B.

Therefore, the efficiency of power supply by the wiring substrate unit 200B of the first embodiment of the present invention can be improved compared to the wiring substrate unit 10 of the comparative example (see FIG. 1).

Similar to the wiring substrate unit 200A illustrated in FIG. 3A, the wiring substrate unit 200B illustrated in FIG. 3B can prevent noise of the coil 150 from reaching, for example, the CPU 240B.

FIG. 3C is a schematic diagram illustrating an example of a wiring substrate unit 200C using the wiring substrate 100 according to the first embodiment of the present invention.

The wiring substrate unit 200C illustrated in FIG. 3C includes a motherboard 220, a package substrate 230C, and a CPU 240C.

The wiring substrate unit 2000 may be used for an electronic device such as a mobile phone, a smart phone terminal, or a game device.

The package substrate 2300 having the CPU 240C loaded thereon is mounted on the motherboard 220 by way of solder 31 of a BGA (Ball Grid Array). The motherboard 220 is, for example, a wiring substrate such as a FR-4 wiring substrate or a built-up substrate. For example, the motherboard 220 is manufactured by layering plural wiring layers and plural insulating layers.

The motherboard 220 is a motherboard using the wiring substrate 100 illustrated in FIG. 2A and includes the coil 150. The coil 150 is electrically connected to the integrated circuit IC and the switching device SW installed in the CPU 240C and the capacitor C mounted to the package substrate 230C, to thereby constitute a power supply circuit 260C.

The package substrate 230C, which has the CPU 240C loaded thereon, functions as an interposer. The package substrate 230C is, for example, a wiring substrate such as a built-up substrate. For example, the package substrate 230C is manufactured by layering plural wiring layers and plural insulating layers.

The package substrate 230C may be the same as the package substrate 30 used in the comparative example. That is, the coil 150 does not need to be included in the package substrate 230C. However, in an alternative example, the coil 150 may be included in the package substrate 230C. In the alternative example, the coil 150 included in the motherboard 220, the coil 150 included in the package substrate 230C, the integrated circuit IC and the switching device SW installed in the CPU 240C, and the capacitor C mounted to the package substrate 230C may constitute the power supply circuit 260C.

The CPU 240C is a processor that performs operations for an electronic device to which the wiring substrate unit 200C is mounted. The CPU 240C includes the switching device SW and the integrated circuit IC that constitute the power supply circuit 260C. The integrated circuit IC functions as a controller of the power supply circuit 260C and drives the switching device SW.

The power supply circuit 260C, which is constituted by the coil 150 installed in the motherboard 220, the integrated circuit IC and switching device SW installed in the CPU 240C, and the capacitor C mounted to the package substrate 230C, supplies power to, for example, a core (not illustrated) of the CPU 240C.

With the wiring substrate unit 200C, power supplied from a power source (e.g., battery (not illustrated)) to the power supply circuit 260C is stepped-down by the power supply circuit 2600. Then, the stepped-down power is supplied from the power supply circuit 2600 to, for example, the core (not illustrated) of the CPU 240C.

A portion of the power supply circuit 260C (integrated chip IC, switching device SW) is included in the CPU 240C. The capacitor C is mounted to the package substrate 230C. The coil 150 is included in the motherboard 220. In other words, the power supply circuit 260C is positioned significantly nearer to the CPU 240C than the power supply circuit 50 of the wiring substrate unit 10 of the comparative example (see FIG. 1).

Therefore, for example, in a case where power having a voltage value 5 V is directly supplied from a power source (e.g., battery (not illustrated)) to the power supply circuit 2600, the power is stepped down to 1 V by the power supply circuit 260C and supplied to, for example, a core (not illustrated) of the CPU 240C.

Accordingly, with the wiring substrate unit 200C illustrated in FIG. 3C, a power source voltage of 5 V can be stepped down by the power supply circuit 260C that is positioned in the immediate vicinity of the core (not illustrated) of the CPU 2400.

Therefore, compared to a case of using the wiring substrate unit 10 (see FIG. 1) of the comparative example to step down a power source voltage of 5 V to 1 V with the power supply circuit 50 and supply the stepped-down voltage to the CPU 40, the wiring substrate unit 2000 according to the first embodiment of the present invention can supply a power source voltage more efficiently.

Moreover, the wiring substrate unit 2000 according to the first embodiment of the present invention can supply a power source voltage more efficiently than the wiring substrate unit 200A illustrated in FIG. 3A.

The power source voltage can be supplied more efficiently because the wiring substrate 100 (see FIG. 2(A)) used as the motherboard 220 includes a small sized coil 150 that provides high inductance. The coil 150 can attain high impedance desired for the power supply circuit 2600.

Therefore, the efficiency of power supply by the wiring substrate unit 2000 of the first embodiment of the present invention can be improved compared to the wiring substrate unit 10 of the comparative example (see FIG. 1).

Similar to the wiring substrate unit 200A illustrated in FIG. 3A, the wiring substrate unit 200C illustrated in FIG. 3C can prevent noise of the coil 150 from reaching, for example, the CPU 240C.

FIGS. 4A-7D are schematic diagrams illustrating processes for manufacturing the wiring substrate 100 according to the first embodiment of the present invention.

Figure 4A:
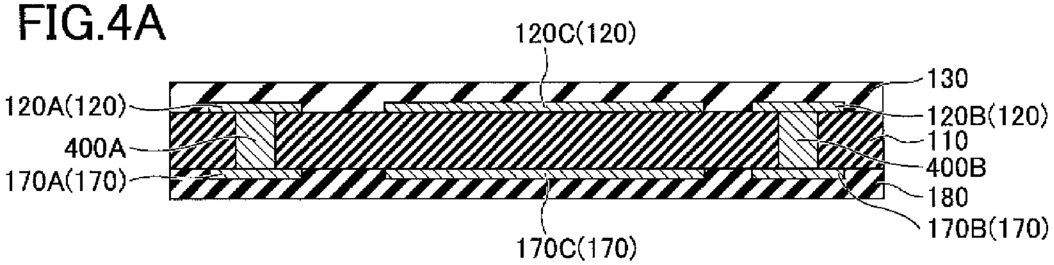
FIGS. 4A-7D are schematic diagrams illustrating processes for manufacturing a wiring substrate according to the first embodiment of the present invention.

As illustrated in FIG. 4A, first, the core substrate 110 is prepared. The core substrate 110 has an upper surface on which the wiring layer 120 is formed and a lower surface on which the wiring layer 170 is formed. The insulating layer 130 is formed on an upper surface of the wiring layer 120, and the insulating layer 180 is formed on a lower surface of the wiring layer 170. The through-hole parts 400A, 400B are formed in the core substrate 110 beforehand.

The insulating layers 130, 180 are formed by using a vacuum laminator in which layers of resin films are formed by applying heat and pressure thereto. The resin film may be a film formed of, for example, a resin material such as epoxy resin or polyimide resin.

Figure 4B:
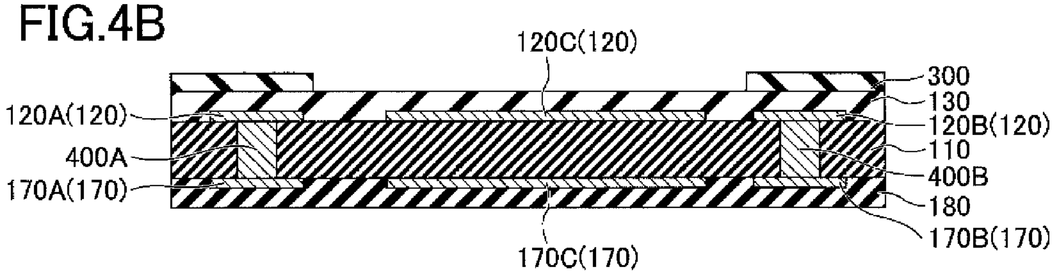

Then, as illustrated in FIG. 4B, a mask 300 is formed on both ends of the upper surface of the insulating layer 130. The mask 300 is formed of, for example, a photosensitive resist material. In the process illustrated in FIG. 4B, the mask 300 is formed by applying a photosensitive resist material on the upper surface of the insulating layer 130 and curing the photosensitive resist material by using a photolithography method.

Figure 4C:
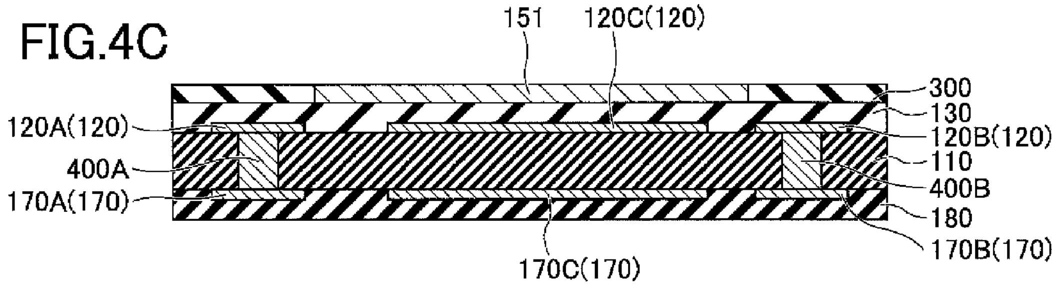

Then, as illustrated in FIG. 4C, the magnetic layer 151 is formed on a portion of the upper surface of the insulating layer 130 where the mask 300 is not formed. The magnetic layer 151 may be formed by using, for example, a spray plating process. For example, a Zn—Fe plating solution may be used in the spray plating process.

The magnetic layer 151 has a film thickness of, for example, 10 μm and an area of 0.85 mm (vertical direction: direction penetrating FIG. 4C)×2 mm (horizontal direction: horizontal direction in FIG. 4C) from a plan view. In this embodiment, the dimensions of the magnetic layer 151 are set, so that the coil 150 can provide an inductance of 7 nH.

The composition of the Zn—Fe alloy used for the magnetic layer 151 is, for example, $Z_{no.36}$—$Fe_{2.54}O_4$. Instead of the Zn—Fe alloy, an alloy having ferrite (Fe) combined with, for example, nickel (Ni), cobalt (Co), beryllium (Be), magnesium (Mg), calcium (Ca), strontium (Sr), barium (Ba), or manganese (Mn) may be used for the magnetic layer 151.

Figure 4D:
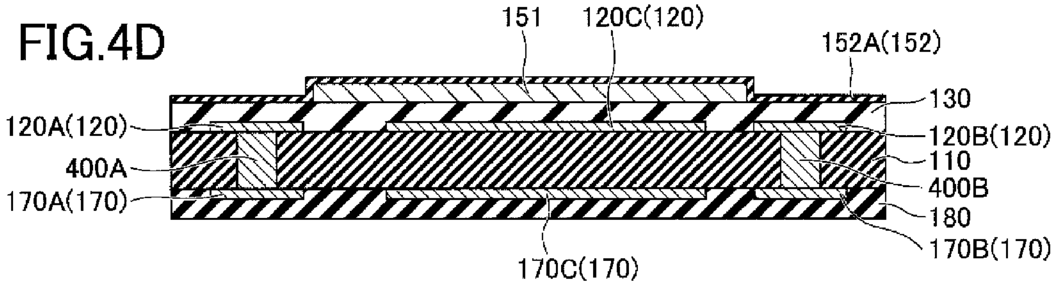

Then, after the mask 300 is removed, an insulating film 152A is formed on the insulating layer 130 and the magnetic layer 151 as illustrated in FIG. 4D. The insulating film 152A is a part of the insulating film 152 illustrated in FIG. 2A and is an example of a first insulating film. The insulating film 152A is formed, so that a fine ruggedness of the insulating film 152A improves the cohesiveness between the magnetic layer 151 and the coil part 153. The thickness of the insulating film 152A may be, for example, approximately 2 μm to 5 μm.

The mask 300 may be removed by, for example, etching with a release solution. Further, the insulating film 152A may be formed by using, for example, a spin-coating method in which a varnish formed of polyimide type resin is applied to the upper surface of the insulating layer 130 and the upper surface of the magnetic layer 151. Alternatively, an epoxy type resin may be used instead of the polyimide type resin.

Figure 5A:
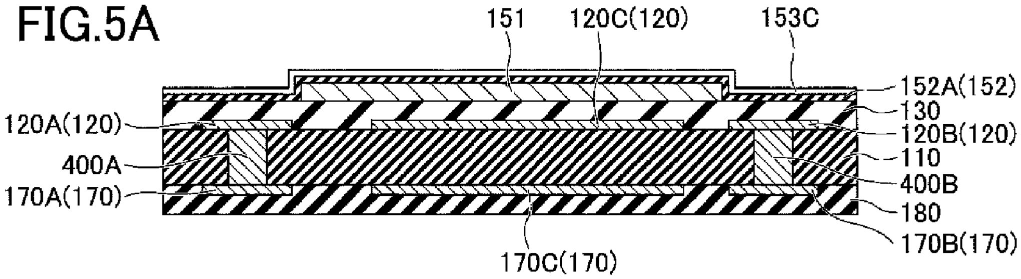

Then, as illustrated in FIG. 5A, a seed layer 153C is formed on an upper surface of the insulating film 152A. The seed layer 153C is a portion that becomes the seed of the coil part 153 when an electroplating process is performed on an upper surface of the seed layer 1530 in a subsequent process (described below).

For example, the seed layer 153C may be formed by sputtering a copper material to the upper surface of the insulating film 152A. Alternatively, the seed layer 153C may be formed by performing an electroless plating process in which a thin copper film is formed on the upper surface of the insulating film. The thickness of the seed layer 153C may be, for example, approximately 0.5 μm to 0.8 μm.

Figure 5B:
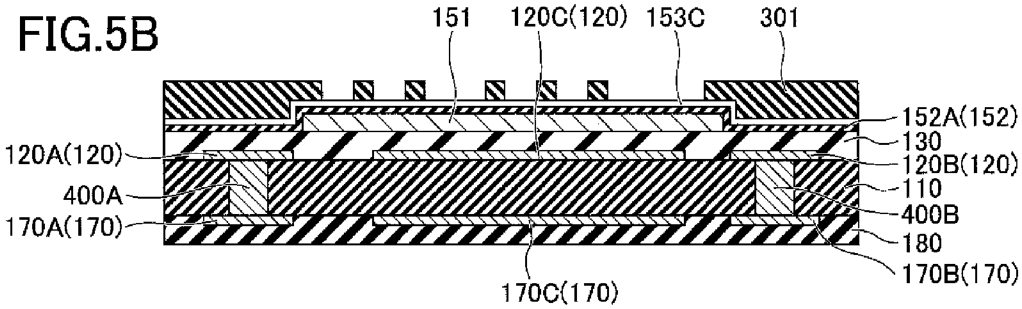

Then, as illustrated in FIG. 5B, a mask 301 is formed on the upper surface of the seed layer 153C. The mask 301 is formed of, for example, a photosensitive resist material. In the process illustrated in FIG. 5B, the mask 301 is formed by applying a photosensitive resist material on the upper surface of the seed layer 153C and curing the photosensitive resist material by using a photolithography method. The mask 301 is to be used for forming the coil part 153 by the electroplating process in a subsequent process. Therefore, the mask 301 is patterned, so that the coil part 153 can be formed into a predetermined shape from a plan view (see FIG. 2C).

Figure 5C:
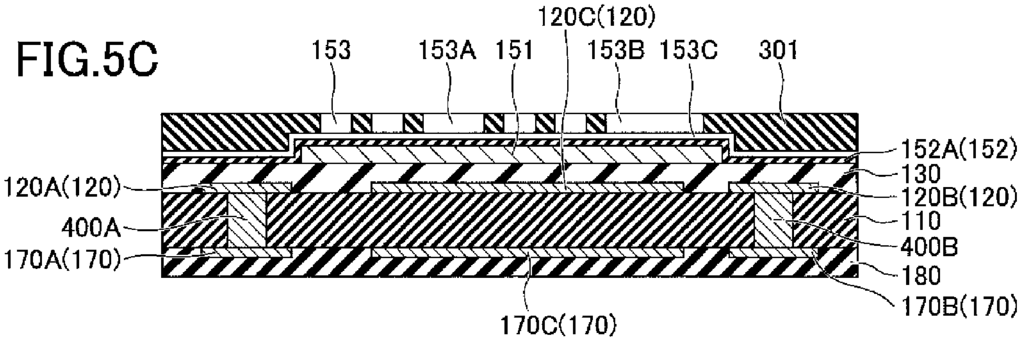

Then, as illustrated in FIG. 5C, the coil part 153 is formed by performing an electroplating process. The coil part 153 is formed of, for example, copper. The electroplating process is performed while feeding power to the seed layer 153C. The thickness of the coil part 153 may be, for example, approximately 20 μm. The seed layer 153 may be formed in an area that is not part of a final product (wiring substrate 100), in other words, an area that is to be removed in a subsequent process. Thereby, this area can be used as a power-feeding pattern.

Figure 5D:
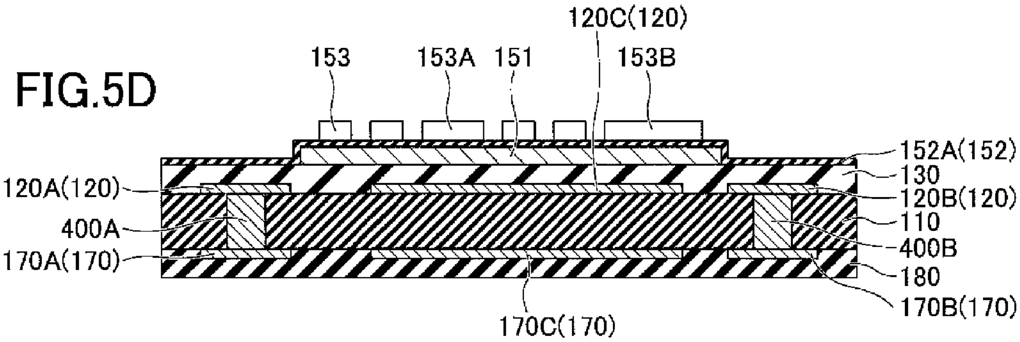

Then, as illustrated in FIG. 5D, the coil part 153 is exposed by removing the mask 301 and the seed layer 153C formed on exposed parts of the coil part 153 (see FIG. 5C). The mask 301 may be removed by, for example, etching with a release solution. The seed layer 153C may be removed by, for example, using a reverse-sputtering method.

In the seed layer 1530 formed in the process illustrated in FIG. 5A, a portion of the seed layer 153C between the coil part 153 (see FIG. 5D) and the insulating film 152 is not removed (remains) by the reverse-sputtering method because the portion of the seed layer 1530 is integrated with the coil part 153.

Thereby, the coil part 153 is formed having a line of 120 μm and a space of 20 μm. The number of coils of the coil part 153 is 2.5 coils.

Alternatively, a wet-etching method may be used instead of the reverse-sputtering method for removing the seed layer 153C.

Figure 6A:
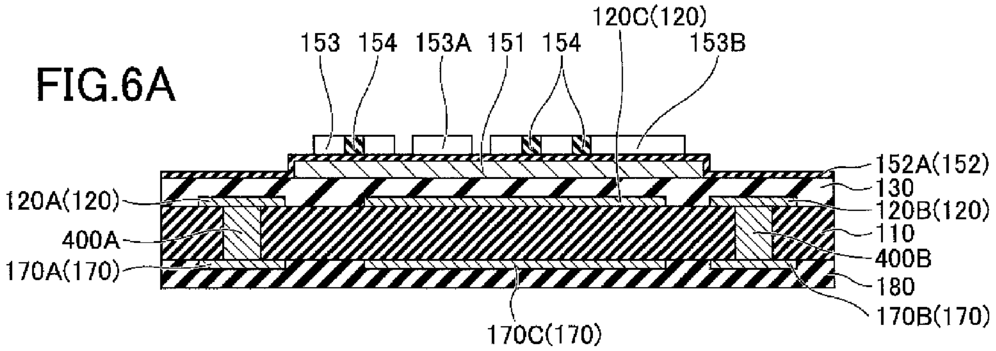

Then, as illustrated in FIG. 6A, the insulating resin 154 is formed between the coils of the coil part 153. The insulating resin 154 is formed in the shaded plan view area illustrated in FIG. 2C. For example, the insulating resin 154 may be formed by applying a photosensitive resist material on the coil part 153 including the area between the coils of the coil part 153 and removing unnecessary parts of the photosensitive resin material by using a photolithography method. For example, a photosensitive epoxy resin may be used as the material of the insulating resin 154.

Figure 6B:
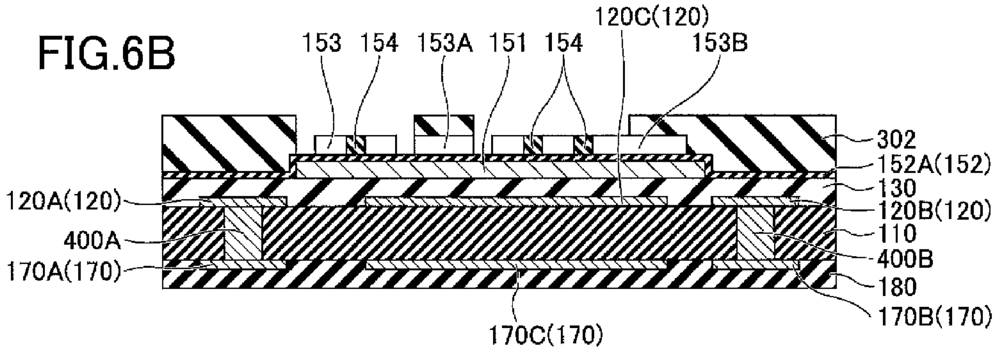

Then, as illustrated in FIG. 6B, a mask 302 is formed. The mask 302 is formed by applying a resist material on the insulating film 152A, the one end 153A, and the other end 153B and performing a photolithography process on the resist material. For example, a photosensitive epoxy resin may be used as the material of the mask 302.

Because the mask 302 is to be used when forming the magnetic layer 155 in a subsequent process, the mask 302 is patterned, so that the magnetic layer 155 can be formed into a predetermined shape from a plan view as illustrated in FIG. 2B. Therefore, with reference to FIGS. 2B, 6B, and 6C, the mask 302 is formed in an area in which the opening 155A is to be formed. Further, with reference to FIGS. 2B, 6B, and 6C, the mask 302 is also formed on the left and right sides of an area on which the magnetic layer 155 is to be formed.

Figure 6C:
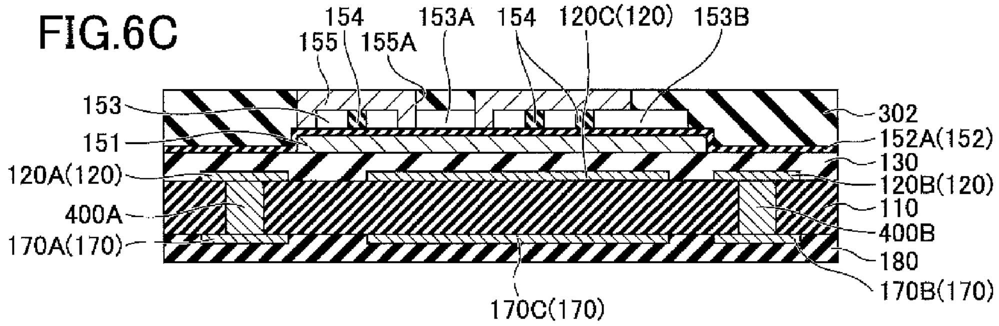

Then, as illustrated in FIG. 6C, the magnetic layer 155 is formed by using the mask 302. The magnetic layer 155 may be formed by using, for example, a spray plating process. For example, a Zn—Fe plating solution may be used in the spray plating process.

The magnetic layer 155 has a film thickness of, for example, 10 μm and an area of 0.85 mm (vertical direction: direction penetrating FIG. 6C)×0.85 mm (horizontal direction: horizontal direction in FIG. 6C) from a plan view. In this embodiment, the dimensions of the magnetic layer 155 are set, so that the coil 150 can provide an inductance of 7 nH.

The composition of the Zn—Fe alloy used for the magnetic layer 155 is, for example, $Z_{no.36}$—$Fe_{2.54}O_4$. Similar to the magnetic layer 151, an alloy having ferrite (Fe) combined with, for example, nickel (Ni), cobalt (Co), beryllium (Be), magnesium (Mg), calcium (Ca), strontium (Sr), barium (Ba), or manganese (Mn) may be used for the magnetic layer 155 instead of the Zn—Fe alloy.

Figure 7A:
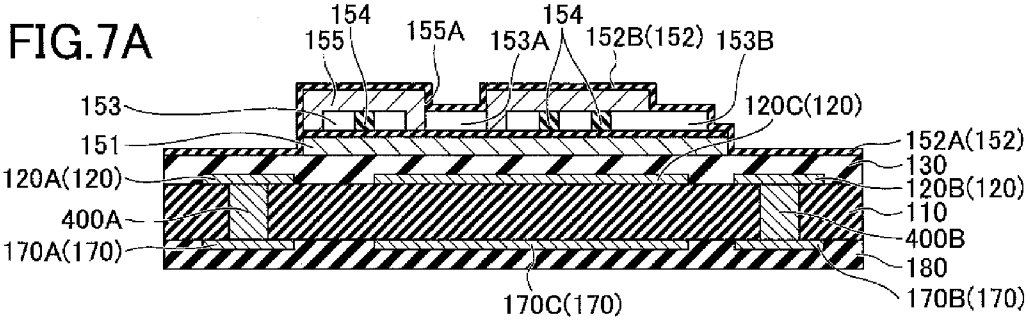

Then, after the mask 302 is removed, an insulating film 152B is formed on the insulating film 152A, the one end 153A of the coil part 153, the other end 153B of the coil part 153, and the magnetic layer 155 as illustrated in FIG. 7A. The insulating film 152B is formed for improving the cohesiveness between the magnetic layer 155 and the insulating layer 140. The thickness of the insulating film 152B may be, for example, approximately 2 μm to 5 μm.

The insulating film 152B is a part of the insulating film 152 illustrated in FIG. 2A and constitutes the insulating film 152 (see FIG. 2A) together with the insulating film 152A formed in the process of FIG. 40. The insulating film 152B is an example of a second insulating film.

The mask 302 may be removed by, for example, etching with a release solution. Further, the insulating film 152B may be formed by using, for example, a spin-coating method in which a varnish formed of polyimide type resin is applied to the insulating film 152A, the one end 153A of the coil part 153, the other end 153B of the coil part 153, and the magnetic layer 155. Alternatively, an epoxy type resin may be used instead of the polyimide type resin.

Figure 7B:
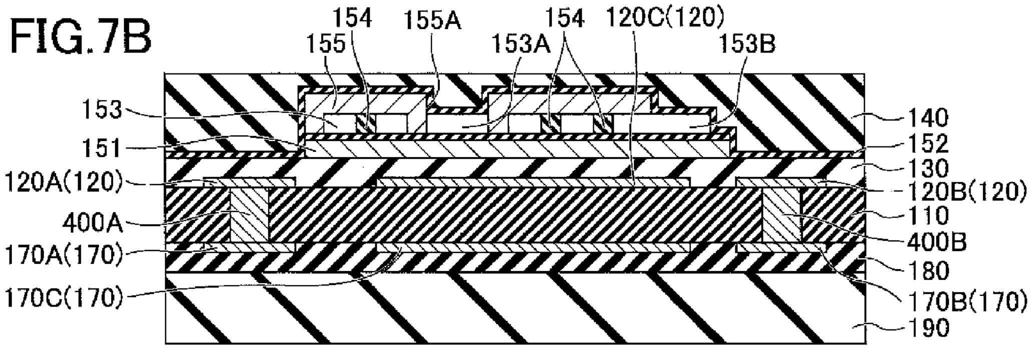
Figure 7C:
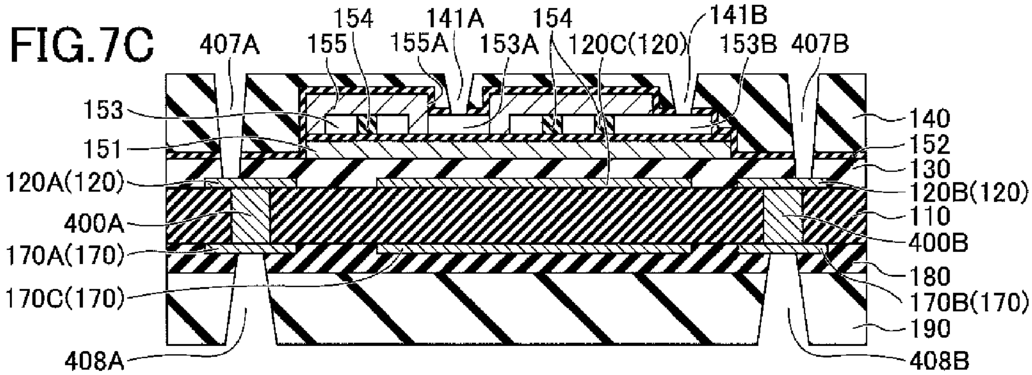

Then, as illustrated in FIG. 7B, the insulating layer 140 is formed on the insulating film 152. Further, the insulating layer 190 is formed on the lower surface of the insulating layer 180.

The insulating layers 140, 190 are formed by using a vacuum laminator in which layers of resin films are formed by applying heat and pressure thereto. The resin film may be a film formed of, for example, a resin material such as epoxy resin or polyimide resin.

Then, as illustrated in FIG. 70, via holes 141A, 141B are formed in the insulating layer 140 and the insulating film 152. Further, via holes 407A, 407B are formed in the insulating layer 140, the insulating film 152, and the insulating layer 130. The via holes 407A, 407B are formed from a surface (upper surface) of the insulating layer 140 to the surfaces (upper surfaces) of the wiring layers 120A, 120B. Further, via holes 408A, 408B are formed in the insulating layer 190 and the insulating layer 180. The via holes 408A, 408B are formed from a surface (lower surface) of the insulating layer 190 to the surfaces (lower surfaces) of the wiring layers 170A, 170B.

The via holes 141A, 141B, 407A, 407B, 408A, 408B may be formed by, for example, a laser processing method. Each of the via holes 141A, 141B has one opening formed on the surface (upper surface) of the coil part 153 and another opening formed on the surface (upper surface) of the insulating layer 140. The one end 153A of the coil part 153 serves as a bottom surface of the via hole 141A, and the other end 153B of the coil part 153 serves as a bottom surface of the via hole 141B. For each of the via holes 141A, 141B, the shape of the cross section may be a circular truncated cone in which the other opening is larger than the one opening. The bottom surfaces of the via holes 141A, 141B are formed by removing the insulating film 152.

The via holes 407A, 407B each have one opening formed on the surface (upper surface) of the wiring layer 120 and another opening formed on the surface (upper surface) of the insulating layer 140. The surface (upper surface) of the wiring layer 120A serves as a bottom surface of the via hole 407A, and the surface (upper surface) of the wiring layer 120B serves as a bottom surface of the via hole 407B. The shape of the cross section of the via holes 407A, 407B may be a circular truncated cone in which the other opening of the via holes 407A, 407B is larger than the one opening of the via holes 407A, 407B.

The via holes 408A, 408B each have one opening formed on the surface (lower surface) of the wiring layer 170 and another opening formed on the surface (lower surface) of the insulating layer 190. The surface (lower surface) of the wiring layer 170A serves as a bottom surface of the via hole 408A, and the surface (lower surface) of the wiring layer 170B serves as a bottom surface of the via hole 408B. The shape of the cross section of the via holes 408A, 408B may be a circular truncated cone in which the other opening of the via holes 408A, 408B is larger than the one opening of the via holes 408A, 408B.

Figure 7D:
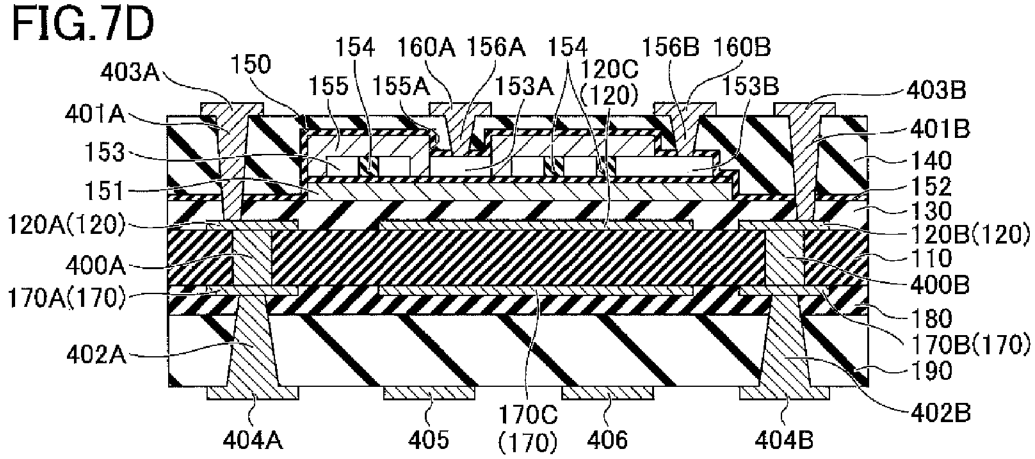

Then, as illustrated in FIG. 7D, vias 156A, 156B are formed inside the via holes 141A, 141B, respectively. Further, wirings 160A, 160E are formed on the vias 156A, 156B, respectively.

Further, vias 401A, 401B, 402A, 402B are formed inside the via holes 407A, 407B, 408A, 408B, respectively.

The vias 156A, 156B may be formed by using, for example, a semi-additive method. In order to form the vias 156A, 156B, first, a seed layer (e.g., copper seed layer) is formed on, for example, the sidewalls and the bottom surfaces of the via holes 141A, 141B and the surface of the insulating layer 140 by using an electroless plating method.

Further, the vias 401A, 401B, 402A, and 402B may also be formed by using, for example, a semi-additive method. In order to form the vias 401A, 401B, first, a seed layer (e.g., copper seed layer) is formed on, for example, the sidewalls and the bottom surfaces of the via holes 407A, 407B and the surfaces of the insulating layer 140, the insulating film 152, and the insulating layer 130 by using an electroless plating method. In order to form the vias 402A, 402B, first, a seed layer (e.g., copper seed layer) is formed on, for example, the sidewalls and the bottom surfaces of the via holes 408A, 408B and the surfaces of the insulating layer 180 and the insulating layer 190 by using an electroless plating method.

Then, a plating resist layer having openings corresponding to the shapes of the wirings 160A, 160B, 403A, 403B are formed on the above-described seed layers. Then, by performing an electroplating process while feeding power to the seed layers, an electrolytic copper plating is deposited on the surfaces of the seed layers exposed from the plating resist layer. Thereby, the vias 156A, 156B can be continuously formed with the wirings 160A, 160B, and the vias 401A, 401B can be continuously formed with the wirings 403A, 403B.

Likewise, the vias 402A, 402B are continuously formed with the wirings 404A, 404B by using a plating resist layer.

Lastly, the plating resist layer is removed. The plating resist layer may be removed by, for example, etching with a release solution. The seed layers remaining on areas that do not include the wirings 160A, 160B, 403A, 403B, 404A, and 404B are removed. The seed layers may be removed by, for example, using a wet-etching method.

Alternatively, the vias 156A, 156B, 401A, 401B, 402A, 402B and the wirings 160A, 160B, 403A, 403B, 404A, 404B may be formed by using a subtractive method or other methods.

Thereby, the manufacturing of the wiring substrate 100 according to the first embodiment of the present invention is completed.

The wiring substrate 100 according to the first embodiment of the present invention includes the coil 150 that can be formed inside the wiring substrate 100 by a plating process. Therefore, by using the wiring substrate 100 as the package substrate 230A, 230B or the motherboard 220 of the wiring substrate units 200A-200C, voltage transformation and power supply can be performed in the immediate vicinity of a core of the CPU 240A-240C. Thereby, power supply efficiency of the power supply circuit 260A-260C can be improved. Further, size reduction of the power supply circuit 260A-260C can be achieved.

Further, manufacturing cost can be reduced because the coil 150 attaining high inductance with the magnetic layers 151, 155 can be installed in the wiring substrate 100 by performing the same processes used for manufacturing a common wiring substrate.

Owing to the coil part 153 provided between the magnetic layer 151 and the magnetic layer 155, the coil 150 exhibits high noise resistance. Therefore, the coil 150 hardly affects the arrangement of wirings or the like. Thus, the degree of freedom for designing peripheral circuits can be improved.

Although the wiring substrate 100 is described as a built-up substrate in the first embodiment of the present invention, the wiring substrate 100 is not limited to a built-up substrate. That is, the wiring substrate 100 may be another type of substrate as long as the substrate has an insulating layer and a wiring layer layered thereon.

In the first embodiment of the present invention, the one end 153A and the other end 153B of the coil 150 are connected to the wiring 160A and the wiring 160B interposed by the via 156A and the via 156B, respectively. However, the one end 153A and the other end 153B of the coil 150 do not necessarily need to be connected to the wirings 160A, 160B positioned in an upper direction of the wiring substrate 100 by way of the vias 156A, 156B. For example, one of the one end 153A and the other end 153B may be drawn in a horizontal direction 100 by way of a wiring layer.

According to the first embodiment of the present invention, the magnetic layer 151 having a larger size than the coil part 153 from a plan view is provided toward the lower surface of the coil part 153 of the coil 150. Further, the magnetic layer 155 is provided toward the upper surface of the coil part 153 for covering.

Alternatively, the magnetic layer 155 may cover the portion(s) of the coil part 153 other than one end 153A and the other end 153B. Further, the magnetic layer 151 may expose a portion of the lower surface of the coil part 153. For example, depending on the arrangement with respect to other wirings or the like, a portion of the coil part 153 may be exposed, so that a sufficient space can be obtained for forming the magnetic layer 151 or the magnetic layer 155.

According to the first embodiment of the present invention, the wiring substrate 100 is described as a built-up substrate including the core substrate 110 (i.e. so-called thin core built-up substrate). Alternatively, the wiring substrate 100 may be a so-called coreless built-up substrate that does not include the core substrate 110.

Next, a modified example of the wiring substrate 100 according to the first embodiment of the present invention is described.

Figure 8:
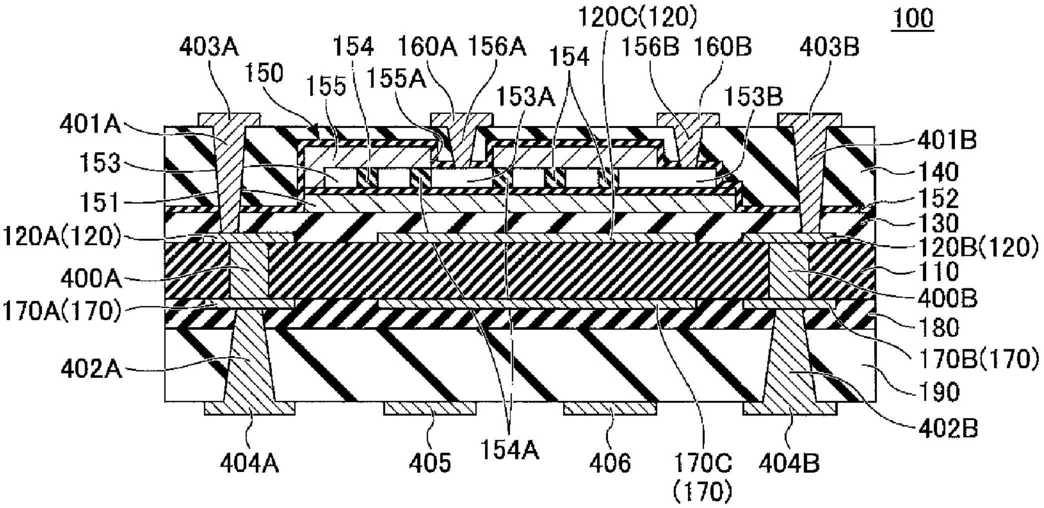
FIG. 8 is a cross-sectional view illustrating a modified example of a wiring substrate according to the first embodiment of the present invention.

FIG. 8 is a cross-sectional view illustrating the modified example of the wiring substrate 100 according to the first embodiment of the present invention.

In the above-described first embodiment of the present invention, the magnetic layer 155 is formed in the periphery of the one end 153A of the coil part 153 (see FIG. 2B).

Alternatively, as illustrated in FIG. 8, an insulating resin 154A may be formed in the periphery of the one end 153A of the coil part 153. The insulating resin 154A is the same resin material used for the insulating resin 154 and is integrally formed with the insulating resin 154.

In a case of forming the magnetic layer 155 in the periphery of the one end 153A by a plating process where the interval between the one end 153A and the coil part 153 (continuing from the periphery of the one end 153A from a plan view) is narrow, a long time may be required to complete the plating process. Thereby, productivity may decrease.

By filling the periphery of the one end 153A with the insulating resin 154A formed of, for example, a photosensitive epoxy resin, manufacturing of the wiring substrate 100 becomes easier compared to a case where the magnetic layer 155 is formed with the plating process.

Further, in a case of forming the magnetic layer 155 in the periphery of the one end 153A by a plating process where the interval between the one end 153A and the coil part 153 (continuing from the periphery of the one end 153A from a plan view) is narrow, voids may be generated in the magnetic layer 155. Therefore, in this case, the insulating resin 154A may be formed in the periphery of the one end 153A instead of the magnetic layer 155. Because the insulating resin 154A is formed simply by filling (supplying) the insulating resin 154A in the periphery of the one end 153A, the generation of voids can be prevented, and the inductance of the coil part 153 can become consistent.

<Second Embodiment>

Figure 9:
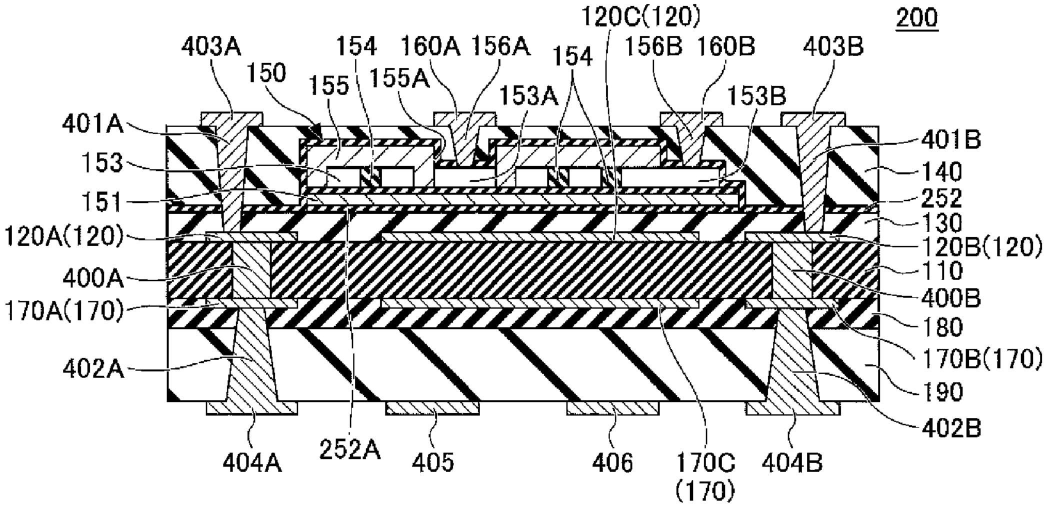
FIG. 9 is a cross-sectional view illustrating a wiring substrate according to the second embodiment of the present invention.

FIG. 9 is a cross-sectional view illustrating a wiring substrate 200 according to the second embodiment of the present invention.

The wiring substrate 200 according to the second embodiment of the present invention is different from the wiring substrate 100 according to the first embodiment of the present invention is that an insulating film 252A which is substantially the same as the insulating film 152 is provided between the insulating layer 130 and the magnetic layer 151 of the wiring substrate 100.

Because the configuration of the wiring substrate 200 is substantially the same as the configuration of the wiring substrate 100 except for the aforementioned difference, like components are denoted with like reference numerals as those of the first embodiment and are not further explained.

The wiring substrate 200 according to the second embodiment of the present invention includes an insulating film 252 instead of the insulating film 152 of the wiring substrate 100 of the first embodiment (see FIG. 2A).

The insulating film 252 is configured having an insulating film 252A added to the above-described insulating film 152 of the wiring substrate 100 (see FIG. 2A). The insulating film 252A is formed between the insulating layer 130 and the magnetic layer 151. The insulating film 252 has substantially the same shape/configuration as the insulating film 152 of the wiring substrate 100 (see FIG. 2) except for the portion corresponding to the insulating film 252A of the insulating film 252.

Similar to the insulating film 152 of the wiring substrate 100 (see FIG. 2A), the insulating film 252A is formed of, for example, a resin film such as a polyimide type resin. Alternatively, an epoxy type resin may be used as the insulating film 252A instead of the polyimide type resin.

The insulating film 252A is integrally formed with a portion of the insulating film 252 other than the insulating film 252A (i.e. portion of the insulating film 252 having substantially the same shape and configuration as those of the insulating film 152 of the wiring substrate 100 (see FIG. 2A)). The insulating film 252 is an example of a third insulating film.

For example, it may be difficult for the magnetic layer 151 to obtain a stable crystal orientation in a case where the magnetic layer 151 is directly formed on the insulating layer 130. Further, in a case where there is a variance in the thickness of the magnetic layer 151 from a plan view, it may be difficult to control the thickness of the magnetic layer 151. In these cases, it is preferable to form the insulating film 252A between the insulating layer 130 and the magnetic layer 151.

The insulating film 252A may be formed on a portion of the insulating layer 130 that corresponds to an area where the magnetic layer 151 is to be formed.

For the sake of convenience, the insulating film 252A is identified separately from the insulating film 252, in order to distinguish the added portion (i.e. insulating film 252A) with respect to the portion of the insulating film 252 having substantially the same shape and configuration as those of the insulating film 152. However, as described above, the insulating film 252A is integrally formed with the portion of the insulating film 252 other than the insulating film 252A. Accordingly, the wiring substrate 200 may be manufactured as described below.

Figure 10:
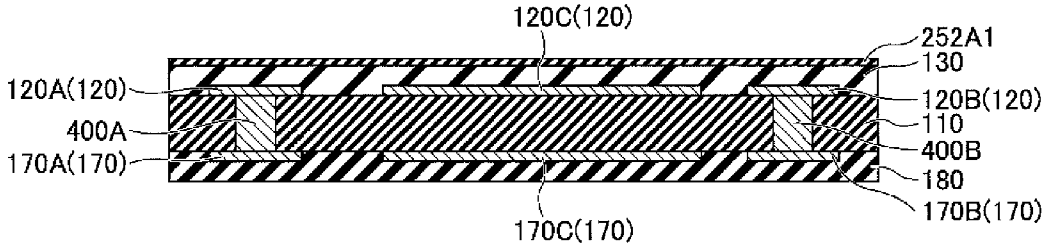
FIG. 10 is a schematic diagram illustrating a process for manufacturing a wiring substrate according to the second embodiment of the present invention.

FIG. 10 is a schematic diagram illustrating a process for manufacturing the wiring substrate 200 according to the second embodiment of the present invention.

First, the insulating film 252A1 is formed on an entire surface (upper surface) of the insulating layer 130 as illustrated in FIG. 10. With reference to the descriptions and drawings of the first embodiment of the present invention, this process corresponds to forming an insulating film on an entire surface (upper surface) of the insulating layer 130 illustrated in FIG. 4A (Step A). A portion that is within the insulating film 252A1 and located below the magnetic layer 151 of FIG. 9 corresponds to the insulating film 252A.

Then, in Step B, by performing the same processes illustrated in FIGS. 4B and 4C, the magnetic layer 151 is formed on the insulating film 252A1 formed on the insulating film 130 in Step A.

Then, in Step C, an insulating film is formed on the magnetic layer 151 formed in Step B and a portion of the insulating film 252A1 that is not covered by the magnetic layer 151 (i.e. a portion of the insulating film 152A of FIG. 4D that is formed on the upper surface of the insulating layer 130).

Then, in Step D, the same processes illustrated in FIGS. 5A-5D and FIGS. 6A-6C are performed. Then, in Step F, an insulating film that is the same as the insulating film 152B of FIG. 7A is formed by performing the process illustrated in FIG. 7A.

By performing the processes of Steps A, C, and F, the forming of the insulating film 252 is completed. The insulating film 252 is a united body constituted by the insulating films formed in Steps A, C, and E.

Because the insulating film 252 is formed of a resin film such as a polyimide film, the surface of the insulating film 252 can be flatter than the insulating layer 130 included in a built-up substrate.

In a case where the performance or properties of the coil 150 can be improved by reducing the thickness of the insulating film 252A included in the insulating film 252, the thickness of the insulating film 252 can be reduced as much as possible.

With the second embodiment of the present invention, the crystal orientation of the magnetic layer 151 formed by a plating process can become more stable by providing the insulating film 252A between the magnetic layer 151 and the insulating layer 130. Further, the thickness of the magnetic layer 151 can be easily controlled.

Similar to the modified example of the wiring substrate 100 according to the first embodiment of the present invention, the wiring substrate 200 according to the second embodiment of the present invention may also be modified.

Figure 11:
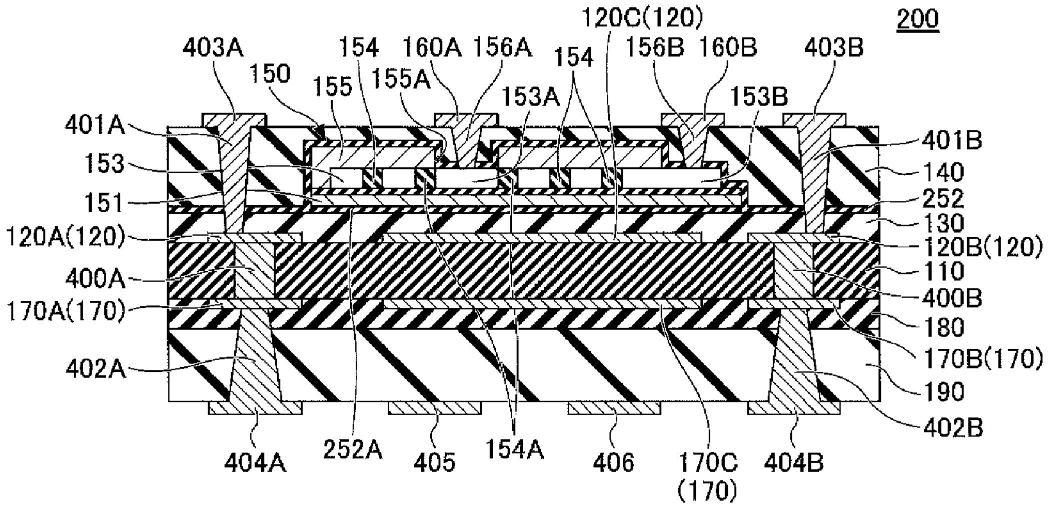
FIG. 11 is a cross-sectional view of a modified example of a wiring substrate according to the second embodiment of the present invention.

FIG. 11 is a cross-sectional view of a modified example of the wiring substrate 200 according to the second embodiment of the present invention. The cross section illustrated in FIG. 11 corresponds to the cross section illustrated in FIG. 9.

Similar to the modified example of the wiring substrate 100 illustrated in FIG. 8, the wiring substrate 200 illustrated in FIG. 11 an insulating resin 154A is formed in the periphery of the one end 153A of the coil part 153.

In a case of forming the magnetic layer 155 in the periphery of the one end 153A by a plating process where the interval between the one end 153A and the coil part 153 (continuing from the periphery of the one end 153A from a plan view) is narrow, a long time may be required to complete the plating process. Thereby, productivity may decrease.

By filling the periphery of the one end 153A with the insulating resin 154A formed of, for example, a photosensitive epoxy resin, manufacturing of the wiring substrate 200 becomes easier compared to a case where the periphery of the one end 153A is filled with the magnetic layer 155 formed with the plating process.

Further, in a case of forming the magnetic layer 155 in the periphery of the one end 153A by a plating process where the interval between the one end 153A and the coil part 153 (continuing from the periphery of the one end 153A from a plan view) is narrow, voids may be generated in the magnetic layer 155. Therefore, in this case, the insulating resin 154A may be formed in the periphery of the one end 153A instead of the magnetic layer 155. Because the insulating resin 154A is formed simply by filling (supplying) the insulating resin 154A in the periphery of the one end 153A, the generation of voids can be prevented, and the inductance of the coil part 153 can become consistent.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring substrate comprising:

a first insulating layer;

a first magnetic layer that is a first plating film formed on the first insulating layer;

a flat coil formed on the first magnetic layer, the flat coil including a coil part having one or more coils;

a second magnetic layer that is a second plating film formed on the flat coil and an insulating part formed in a space between the one or more coils of the coil part from a plan view, the insulating part including a side surface covered by the flat coil, an upper surface of the insulating part being flush with an upper surface of the flat coil;

wherein the insulating part is formed between the one or more coils except at a periphery of one end of the coil part and a portion of a periphery of another end of the coil part from the plan view, wherein the second magnetic layer is formed directly on top of the insulating part, wherein the flat coil is a third plating film.

2. The wiring substrate as claimed in claim 1, further comprising:

an insulating film formed between the flat coil and the first magnetic layer.

3. The wiring substrate as claimed in claim 1, further comprising:

a second insulating layer formed on the second magnetic layer;

a first wiring part formed on the second insulating layer; and a first via that penetrates the second insulating layer and the second magnetic layer;

wherein the flat coil has one end that is connected to the first wiring part by the first via.

4. The wiring substrate as claimed in claim 3, further comprising:

a second wiring part formed on the second insulating layer; and a second via that penetrates the second insulating layer;

wherein the flat coil has another end that is connected to the second wiring part by the second via.

5. The wiring substrate as claimed in claim 3, wherein the second magnetic layer includes an opening to which the first via is inserted.

6. The wiring substrate as claimed in claim 3, further comprising an insulating film formed between the second magnetic layer and the second insulating layer.

7. The wiring substrate as claimed in claim 1, further comprising:

an insulating film formed between the first insulating layer and the first magnetic layer.

8. The wiring substrate as claimed in claim 1, wherein the flat coil includes the coil part having a thickness of 10 μm-20 μm.

9. The wiring substrate as claimed in claim 1, wherein the flat coil includes an upper surface, an outermost side surface, and an innermost side surface, wherein the second magnetic layer covers the upper surface, the outermost side surface, and the innermost side surface of the flat coil.

10. The wiring substrate as claimed in claim 1, wherein each of the first and second magnetic layers includes a magnetic material formed of an alloy having ferrite combined with zinc, nickel, cobalt, beryllium, magnesium, calcium, strontium, barium, or manganese.

11. The wiring substrate as claimed in claim 1, wherein the flat coil is a single coil.

12. The wiring substrate as claimed in claim 1, wherein the flat coil has a rectangular cross section.

13. A wiring substrate comprising:

a first insulating layer;

a first magnetic layer that is a first plating film formed on the first insulating layer;

a flat coil formed on the first magnetic layer, the flat coil including a coil part having one or more coils;

a second magnetic layer that is a second plating film formed on the flat coil;

a first insulating film formed between the flat coil and the first magnetic layer; and a second insulating layer formed on the second magnetic layer;

a first wiring part formed on the second insulating layer;

a first via that penetrates the second insulating layer and the second magnetic layer;

a second insulating film formed between the second magnetic layer and the second insulating layer; and an insulating part formed in a space between the one or more coils of the coil part from a plan view, the insulating part including a side surface covered by the flat coil, an upper surface of the insulating part being flush with an upper surface of the flat coil;

wherein the insulating part is formed between the one or more coils except at a periphery of one end of the coil part and a portion of a periphery of another end of the coil part from the plan view, wherein the second magnetic layer is formed directly on top of the insulating part, wherein the flat coil has one end that is connected to the first wiring part by the first via;

wherein the flat coil is a third plating film.

14. The wiring substrate as claimed in claim 13, further comprising:

a third insulating film formed between the first insulating layer and the first magnetic layer.

15. The wiring substrate as claimed in claim 13, wherein the flat coil includes the coil part having a thickness of 10 μm-20 μm.

16. The wiring substrate as claimed in claim 13, wherein the flat coil includes an upper surface, an outermost side surface, and an innermost side surface, wherein the second magnetic layer covers the upper surface, the outermost side surface, and the innermost side surface of the flat coil.

17. The wiring substrate as claimed in claim 13, wherein each of the first and second magnetic layers includes a magnetic material formed of an alloy having ferrite combined with zinc, nickel, cobalt, beryllium, magnesium, calcium, strontium, barium, or manganese.

18. The wiring substrate as claimed in claim 13, wherein the flat coil is a single coil.

19. The wiring substrate as claimed in claim 13, wherein the flat coil has a rectangular cross section.

20. A method for manufacturing a wiring substrate comprising the steps of:

forming a first magnetic layer on a first insulating layer by a first plating process;

forming a flat coil on the first magnetic layer, the flat coil including a coil part having one or more coils;

forming an insulating part in a space between the one or more coils of the coil part from a plan view, the insulating part including a side surface covered by the flat coil, an upper surface of the insulating part being flush with an upper surface of the flat coil, and forming a second magnetic layer on the flat coil and on the insulating part by a second plating process;

wherein the insulating part is formed between the one or more coils except at a periphery of one end of the coil part and a portion of a periphery of another end of the coil part from the plan view, wherein the second magnetic layer is formed directly on top of the insulating part, wherein the flat coil is a third plating film that is formed by a plating process.

21. The method as claimed in claim 20, wherein the flat coil includes the coil part having a thickness of 10 μm-20 μm.

22. The method as claimed in claim 20, wherein the flat coil includes an upper surface, an outermost side surface, and an innermost side surface, wherein the second magnetic layer covers the upper surface, the outermost side surface, and the innermost side surface of the flat coil.

23. The method as claimed in claim 20, wherein each of the first and second magnetic layers includes a magnetic material formed of an alloy having ferrite combined with zinc, nickel, cobalt, beryllium, magnesium, calcium, strontium, barium, or manganese.

24. The method as claimed in claim 20, wherein the flat coil is a single coil formed by the plating process.

25. The method as claimed in claim 20, wherein the flat coil has a rectangular cross section.

* * * * *